(12) United States Patent
Böhm et al.

(10) Patent No.: US 6,518,558 B1
(45) Date of Patent: Feb. 11, 2003

(54) COLOR IMAGE SENSOR FOR SHORT-TIME EXPOSURE

(76) Inventors: Markus Böhm, Hölderlinstr. 3, D-57068 Siegen (DE); Peter Rieve, Hauptstr. 142, D-51570 Windeck-Dattenfeld (DE); Tarek Lule, Am Eichenhang 21, D-57076 Siegen (DE)

( * ) Notice: Subject to any disclaimer, the term of this patent is extended or adjusted under 35 U.S.C. 154(b) by 0 days.

(21) Appl. No.: 09/672,667

(22) Filed: Sep. 28, 2000

Related U.S. Application Data

(63) Continuation-in-part of application No. 09/101,284, filed as application No. PCT/EP97/05978 on Oct. 30, 1997, now abandoned.

(30) Foreign Application Priority Data

Oct. 31, 1996 (DE) .......................................... 196 43 972

(51) Int. Cl.[7] .................................................. H04N 3/14
(52) U.S. Cl. .............................. 250/208.1; 250/214 A; 308/301; 308/274
(58) Field of Search ........................ 250/208.1, 214 A, 250/214 LA, 214 AG, 214 DC, 226; 348/294, 295, 297, 301, 307, 309, 311, 271; 327/514, 515

(56) References Cited

U.S. PATENT DOCUMENTS 4,989,075 A  1/1991  Ito .............................. 358/41
5,998,778 A  12/1999  Kimata .................... 250/208.1

FOREIGN PATENT DOCUMENTS

| EP | 0 603 877 A2 | 6/1994 |
| EP | 0 774 870 A2 | 5/1997 |
| JP | 7-250287 | 9/1995 |
| WO | WO 96/13865 | 5/1996 |

Primary Examiner—Kevin Pyo

(57) ABSTRACT

The invention relates to an optical sensor consisting of an arrangement of pixel units, each comprising an optoelectronic converter for converting the incident radiation into a photoelectric current that depends on intensity and wavelength, an integrator median for deriving a measured value corresponding to the photoelectric current detected, and a controllable storage device for storing the measured value, and a readout control device for readout of the stored measured values based on one pixel unit, where the image striking the sensor can be assembled from the measured values based on pixel units. The object of creating an optical sensor permitting operation within a short exposure time is achieved by the fact that each pixel unit has integrator median (7, 8; 11, 12; 15, 16) and at least two parallel storage device (21, 22, 23), such that at least two measured values, each assigned to different spectral ranges of the incident radiation, can be detected and stored during the measurement period and then can be read out together to form the relevant color information for the pixel element.

25 Claims, 11 Drawing Sheets

COLOR IMAGE SENSOR FOR SHORT-TIME EXPOSURE

RELATED APPLICATION

This application is a continuation-in-part of Ser. No. 09/101,284, filed Aug. 21, 1998, now abandoned, which is a 371 of PCT/EP97/05978 filed Oct. 30, 1997.

FIELD OF THE INVENTION

The invention relates to an optical sensor consisting of an arrangement of pixel units, each comprising an optoelectronic converter for converting the incident radiation into a photoelectric current that depends on intensity and wavelength, an integrator means for deriving a measured value corresponding to the photoelectric current detected, and a controllable storage means for storing the measured value, and a readout control device for readout of the stored measured values relative to one pixel unit, wherein the image striking the sensor can be composed of the measured values based on pixel units.

BACKGROUND OF THE INVENTION

The function of optical sensors is to pick up an image scene and convert it to electric signals so that multiple image segments are generated, differing in weighting of the various spectral components emitted by the scene. For the visible spectral range, the break-down into the blue, green and red spectral ranges has proven especially advantageous, because this spectral weighting permits a colored reproduction of image scenes adapted to the human eye.

Known image sensors with color resolution (A. J. P. Theuwissen, Solid-State Imaging with Charge-Coupled Devices, Kluwer Academic Publishers, Dordrecht, chapter 6.2, p. 2, pp. 165 ff., 1995) are characterized in that more than one signal must be detected for each pixel. As a rule, a three-way division is performed according to the three color components red, green and blue. Only these color signals, taken together, yield the complete color information of a pixel which can be reproduced from the three linearly independent individual signals within the context of a signal transmission link.

Technically, there are multiple possibilities of implementing the aforementioned color resolution. The methods of generating the spectrally weighted image segments can be subdivided roughly into two types. The first,type of such color imaging methods (A. J. P. Theuwissen, Solid-State Imaging with Charge-Coupled Devices, Kluwer Academic Publishers, Dordrecht, chapter 6.2.4, pp. 171 ff., 1995) uses multiple image sensors whose spectral sensitivities differ by the introduction of color filters into the respective beam paths of the individual sensors. This method has the disadvantage that the individual beam paths must be adjusted so that they lead to completely identical images of the scene on the image sensors, because otherwise the reconstructed component color images cannot be combined so that they coincide, which leads to color shifts.

The second type of color imaging method (A. J. P. Theuwissen, Solid-State Imaging with Charge-Coupled Devices, Kluwer Academic Publishers, Dordrecht, chapter 6.2.2, pp. 168 ff., 1995) uses special color image sensors where adjacent pixels for different spectral ranges are made sensitive by applying multiple color filters in a mosaic. Although the component color images of these sensors are thus automatically congruent to one another in this way, the effective resolution with this method drops by a factor of three to four, because three or four adjacent sensor pixels are needed to extract the complete color information of a pixel.

Furthermore, it is also possible to combine the types described previously (A. J. P. Theuwissen, Solid-State Imaging with Charge-Coupled Devices, Kluwer Academic Publishers, Dordrecht, chapter 6.2.4, pp. 171 ff., 1995), where one spectral range, for example, the green component, is recorded by one sensor, while the other spectral ranges, namely the red and blue components in this example, are recorded by a mosaic two-color sensor. This compromise has the disadvantages of both of the basic.types, although to a diminished extent.

An alternative to this is formed by sequential recording of three image segments, representing the red, green and blue components, respectively, of the light assigned to the pixel. The complete image must be read out immediately after exposure of an image segment. Meanwhile, the three component color images are separated from one another in time by the unavoidable readout operations. The duration of the readout operations depends on the number of pixels and consequently on the lateral resolution of the image sensor, so that following an increase in resolution and number of pixels, an increase in readout time can also be expected in this regard. The readout cycles inserted between exposures of component color images consequently make it impossible to record scenes in which there is movement, because then the three image segments no longer coincide. Moreover, this mode of operation of a color sensor does not allow a color image to be recorded within the flash time available for an exposure with a flash apparatus.

The object of the invention is to create an optical sensor which permits operation within a short exposure time.

SUMMARY OF THE INVENTION

The problem is solved according to this invention by the fact that the optoelectronic converter can be controlled selectively with regard to its spectral sensitivity and that each pixel unit comprises an integrator means and at least two storage means arranged in parallel, such that at least two measured values assigned to different spectral ranges of the incident radiation can be detected and stored during the measurement period and then read out together to form the relevant color information for the pixel element.

According to this invention, each of the pixels of a color sensor is equipped with multiple storage cells which permit temporary storage of the color components. In this way, multiple image segments corresponding to the individual color components can be recorded in succession without having to read out the information of the complete image sensor after exposure of an image segment. The time-consuming readout operations can now be shifted to the end of the entire exposure cycle, consisting of multiple successive individual exposures.

The solution achieved according to this invention thus creates an integrating imaging optical color-sensitive image sensor, where each pixel can record the complete color information according to the light striking it and can make it available in electronic form in each subsequent image cycle. The sensor is characterized by two essential properties: each pixel of the sensor structure, which is organized in a matrix, has a plurality of information storage devices to permit temporary storage of the different color information. In addition, the sensor contains controllable detector elements whose spectral sensitivity can be varied. An image sensor according to this invention thus makes it possible to record all the color information of an image scene by immediate successive exposure of the individual color components without requiring a readout operation between the individual exposures. In this way, short exposure times can be implemented with undiminished resolution at the same time. In particular, the present sensor structure is suitable for recording color images within a single exposure cycle of a short-term lighting system (flash apparatus), for example.

A complete image cycle using a color image sensor according to this invention consists of the following steps, for example:
1. Exposure of the first individual image (e.g., red).
2. Storage of the first individual image.
3. Exposure of the second individual image (e.g., green).
4. Storage of the second individual image.
5. Exposure of the third individual image (e.g., blue).
6. Storage of the third individual image.
7. Readout of the first individual image.
8. Readout of the second individual image.
9. Readout of the third individual image.

Essentially any sequence is possible for recording and storage of the measured values belonging to the individual images and their readout. The individual images may also be exposed and stored simultaneously.

The important advantage of a color sensor that operates according to this mode of operation in comparison with a mode of operation wherein the individual exposures are each interrupted by readout of the individual images is the short total exposure time, which includes only processes numbered 1 through 5 in the above list, while the time-consuming readout processes 7 through 9 are not counted as the actual exposure.

The method is suitable in particular for recording color images using a short-term lighting system, such as a flash apparatus, wherein the total exposure can take place within a single lighting cycle. As a rule, there is no disadvantage to shifting all the readout processes to the end of a complete image cycle.

Readout of the different color information need not necessarily take place in chronological order, but instead may also take place simultaneously with a suitable configuration of the sensor in the form of multiple parallel readout lines, thereby shortening the duration of the readout operation.

A preferred embodiment of a color image sensor according to the invention proposes implementation of the sensor function described above within an optical sensor system in thin film on ASIC (TFA) technology. A TFA image sensor consists of an optically active detector layer in the form of a thin film structure which is integrated vertically into an integrated circuit, such as an ASIC (application-specific integrated circuit). The ASIC contains the pixel structure organized into a matrix, including the required pixel circuits for integration of the photoelectric current, for storage of the color signals and for readout thereof. The optical detector consists of a multi-layer system based on amorphous silicon, which has a spectral sensitivity that can be controlled with the help of the applied electric voltage.

The optical sensor preferably has the following layer structure:
(a) an n-conducting a-Si:H (amorphous hydrogeneated silicon) layer,
(b) a first intrinsically conducting a-Si:H layer,
(c) a p-conducting a-Si:H layer,
(d) a second intrinsically conducting a-Si:H layer, consisting of a first component layer with a higher $\mu$Tau product the product of the movement $\mu$ and the lifetime Tau of the charge carrier and a second component layer with a lower $\mu$-Tau product in comparison with the first component layer,
(e) an n-conducting a-Si:H layer.

According to the nipin structure described above, a pinip structure can also be produced by exchanging n- and p-conducting layers.

Especially good suitability for the color image sensor described here for short-term exposure is obtained when the following layer structure is used:
(a) a p-conducting a-Si:H layer,
(b) an intrinsically conducting a-Si:H layer, consisting of three component layers (I, II, III) with different dielectric constants, where component layers having a low dielectric constant precede component layers having a higher dielectric constant in the direction of incidence of light,
(c) an n-conducting a-Si:H layer.

It is also especially suitable for the color image sensor described here for short-term exposure when the following layer structure is used:
(a) a p-conducting a-Si:H layer,
(b) an intrinsically conducting a-Si:H layer, consisting of three component layers having different dielectric constants, where component layers having a low dielectric constant precede component layers having a higher dielectric constant in the direction of incidence of light,
(c) a p-conducting a-Si:H layer.

This yields a so-called $pi^3n$ or $ni^3p$ structure.

Operation of the sensor involves applying the various detector voltages, which lead to the different color sensitivities, in succession, and integrating into the ASIC the resulting photoelectric currents, which are a measure of the different color components of the light striking the respective pixel, and depositing them in corresponding storage cells. For example, the photoelectric currents that are established with three linearly independent color sensitivities (e.g., red, green, blue) may be integrated and stored in three analog storage cells. Each of the storage cells may consist, for example, of a capacitor in which integration of the photoelectric current over time generates a proportional voltage which is then stored in said capacitor until readout of the pixel. The three capacitors may be arranged laterally (side by side) or vertically (one above the other) in the pixel. In this connection, gate capacitors of the MOS transistors or capacitors between different metallization levels of an ASIC, for example, may be used as storage cells. The ASIC technology thus makes it possible to implement multiple storage cells vertically one above the other, so that especially space-saving configurations can be achieved. The important advantage of such an embodiment is that, in contrast with multiple laterally arranged photodetectors, the storage capacitors can be miniaturized without any loss of sensor sensitivity, so that in this way it is in principle possible to achieve a greater resolution without any sacrifice with regard to the dynamic extent. Meanwhile, the entire sensor surface can be utilized optically, because the storage cells are integrated vertically and do not entail any loss with regard to the area filling factor.

The capacitors also serve to integrate the photoelectric current at the same time, i.e., to convert it into a voltage signal, and to store this voltage signal. In addition to being dependent on the photoelectric current, as described above, the voltage level is proportional to integration time and inversely proportional to integration capacity. Different gains can be achieved in the individual color channels through the use of capacitors with different capacities for integration of the three photoelectric current signals and/or through a choice of different integration times, to compensate for any differences in color sensitivity that might be inherent in the detector.

In principle, through a suitable design of the pixel circuits, it is possible for the photoelectric currents to be converted in the sensor pixel into digital signals which are then stored digitally in the respective storage cells.

In the embodiment of a color image sensor in TFA technology, the photoelectric current signals corresponding to the color components are integrated and stored in multiple storage cells that are integrated laterally or vertically into each pixel of the ASIC, whereas the photoelectric currents themselves are generated with the help of a color-selective and electrically controllable optical detector in thin film technology applied vertically to the ASIC.

Another advantageous embodiment of the color image sensor according to this invention consists of the fact that all pixels are exposed simultaneously with respect to each of the color components. In comparison with an exposure slit traveling over the image sensor, this method has the advantage that there is no distortion of the image due to non-synchronous exposure of the individual color images.

Another advantageous embodiment of the color image sensor according to this invention consists of the fact that it is possible to select a mode of operation wherein the total exposure time for all individual images is so short that a complete color image is exposed within a single lighting phase of a short-term lighting system. In addition, the possibility of using multiple, individual, chronologically successive, colored flashes in synchronization with the exposure of the individual images is not ruled out, and the option of controlling the color sensitivity of the optical detector may be omitted in this case. Furthermore, it is also possible to use controllable optical filter layers which vary the spectral component striking the sensor, again in synchronization with the exposure of the individual images. Again in this case, it is not absolutely necessary to be able to control the color sensitivity of the optical detector.

Another advantageous embodiment of the color image sensor according to this invention consists of the fact that lighting is provided by a known so-called linear flash which has flash times of up to 20 ms with an intensity that is mostly constant over time. This method is suitable in particular when longer exposure times are required due to transient effects with regard to color detectors.

Another advantageous embodiment of the color image sensor according to this invention consists of the fact that in addition to the light- and color-sensitive detectors, the sensor also has incorporated into it other radiation-sensitive elements which have a sensitivity with regard to the infrared or ultraviolet spectral range, for example. In this case, additional storage elements in which are stored the detected signals corresponding to the spectral components outside the visible range may also be integrated. With regard to the mode of operation of the sensor as well as the chronological sequence of integration, storage and readout, the same schematics also apply accordingly as for a sensor which is sensitive only in the visible range.

Another advantageous embodiment of the color image sensor according to this invention consists of the fact that the individual color channels have a selective gain. In this way, different color sensitivities of the detector can be compensated. Selective gain can be achieved, for example, by appropriate dimensioning of the integration and storage capacities or by selecting different integration times in integration of the photoelectric currents.

Another advantageous embodiment of the color image sensor according to this invention consists of the fact that a color correction can be performed, for example, by the known measure of a linear linkage in the form of weighted addition of color signals. In this way, the spectral selectivity of the individual color channels can be improved so that color distortion can be reduced. Appropriate electronic circuits for color correction can be accommodated within the pixel electronics or in the peripheral electronics of the color image sensor.

Another advantageous embodiment of the color image sensor according to this invention consists of the fact that the number of readout lines matches the number of color memories provided in each pixel, so that a synchronous readout of all color information can be performed with the goal of shortening the total required readout time.

Another advantageous embodiment of the color image sensor according to this invention consists of the fact that the integrator device is provided with a period-controlling device for determining the end point of the integration period such that higher radiation intensities lead to shorter integration periods and lower radiation intensities lead to longer integration periods. To increase the dynamic extent, a so-called global or local-adaptive or local-autoadaptive control of sensitivity is utilized, according to which the sensitivity of each pixel is adapted automatically or otherwise to the image brightness prevailing locally. With respect to the use of this method in color sensors, it should be pointed out that sensitivity must be controlled separately for each of the different color components, with additional storage elements optionally being provided in the sensor pixels.

Another advantageous embodiment of the color image sensor according to this invention consists of the fact that the color image sensor is designed as a line sensor or as a two-dimensional pixel matrix. In the case of a linear sensor structure in the form of a line sensor, very small pixel sizes (for example, 10×10 $\mu m^2$) and pixel spacings (for example, 2 $\mu m$) may be achieved by using the technologies currently available, because the pixel electronics can also be positioned next to the optically active areas.

Another advantageous embodiment of the color image sensor according to this invention consists of the fact that additional optical elements are integrated into the light-sensitive layer. For example, an arrangement of micro-lenses structured in a pixel grid system may be used for optical input of the beam into the sensor without requiring any additional expensive imaging optical systems. In this way, it is possible to implement compact imaging color sensors with integrated imaging optical systems (facet eye) which are suitable for use as retinal implants (artificial retina) in the human eye.

Another preferred embodiment provides for each storage means a comparator device in which a reference signal for a preselected color can be deposited. This variant makes it possible to achieve a so-called "color tracker" where a certain color, e.g., a certain red color value, is preselected as the reference value. If this color value then appears in the image recorded, this is ascertained by the comparator device which can then issue the proper signal.

Another advantageous embodiment of the device described above is illustrated in the following figures and explained in greater detail. The embodiment is a pixel for short-term exposure according to this invention in a TFA technology implementation.

BRIEF DESCRIPTION OF THE DRAWINGS

Figures 9A, 9B, 9C, 9D:
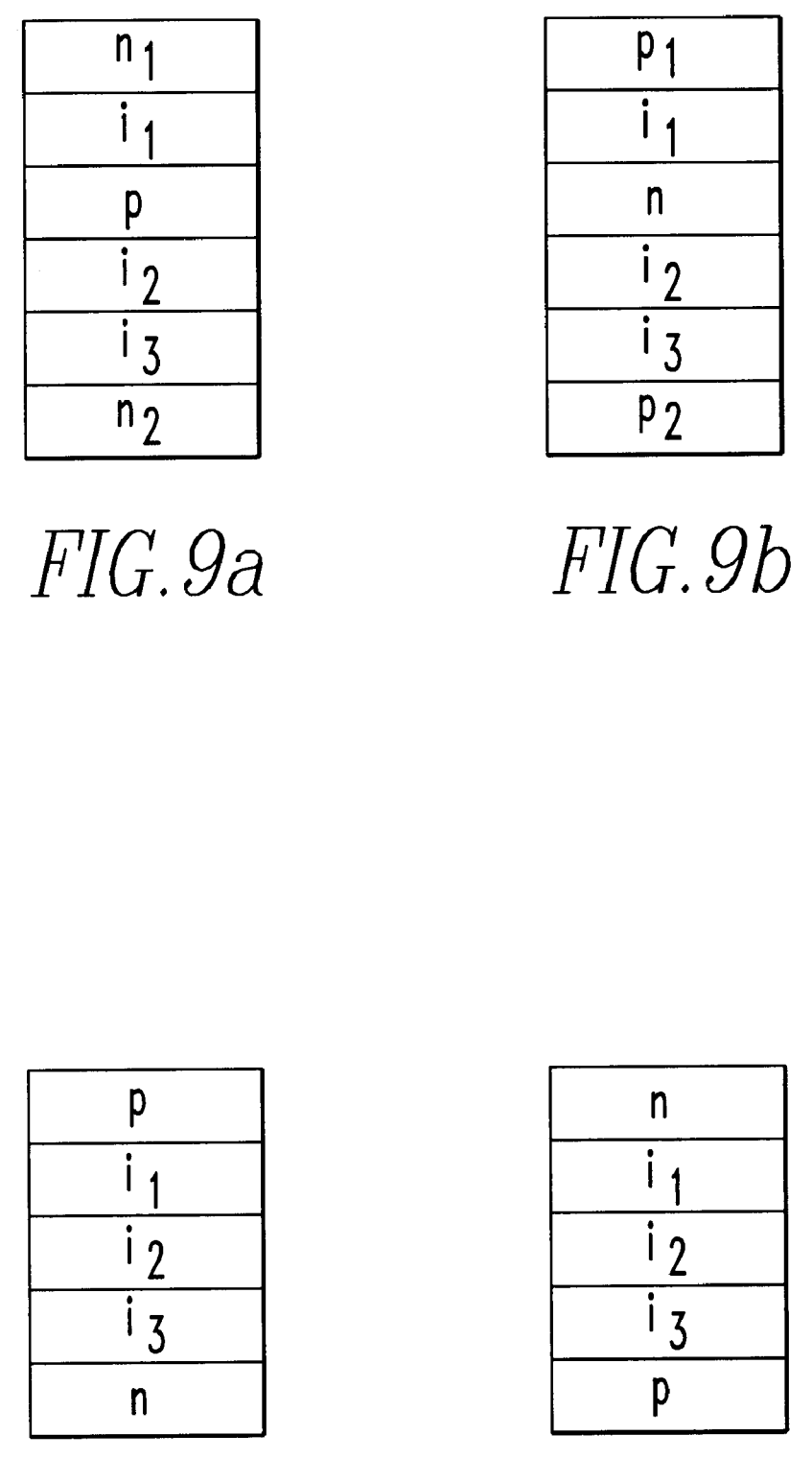

FIGS. 9A–9D show the layer sequence of an optical sensor.

DETAILED DESCRIPTION OF THE INVENTION

Figure 1:
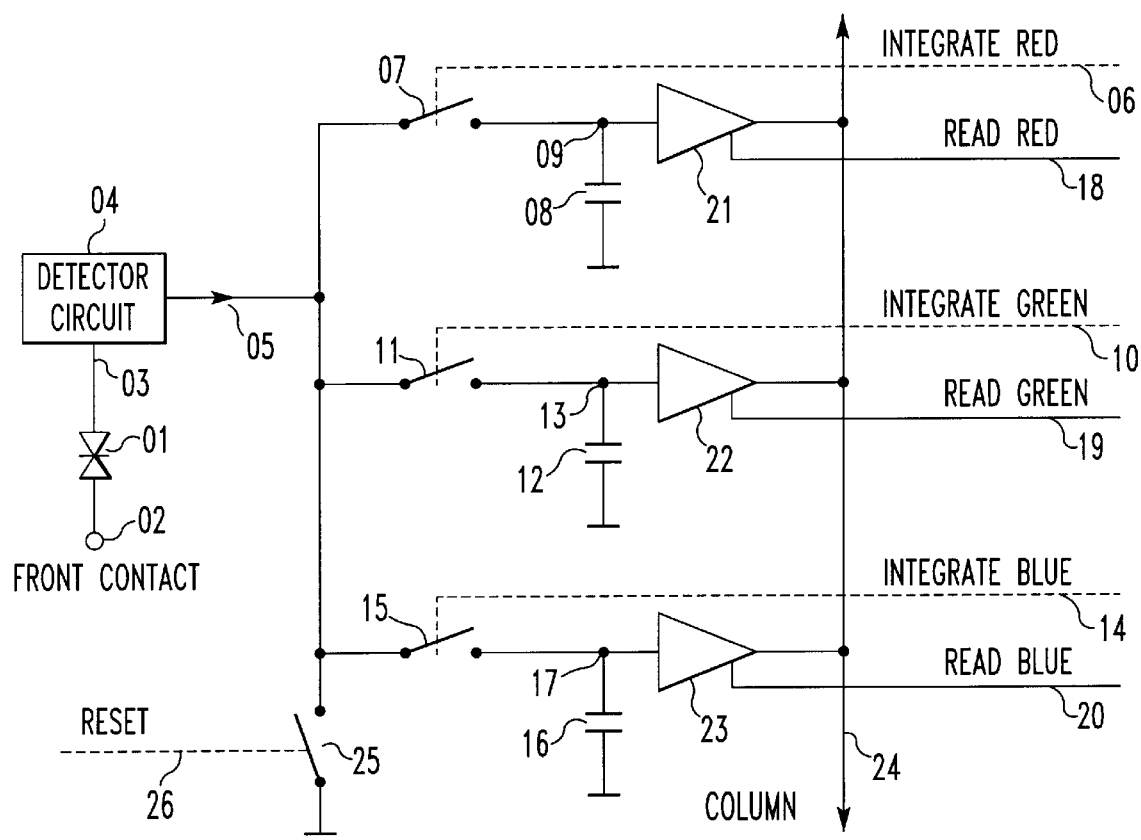
FIG. 1 shows the block diagram of the pixel electronics for short-term exposure with the three intergration circuits for red, green and blue.
Figure 3:
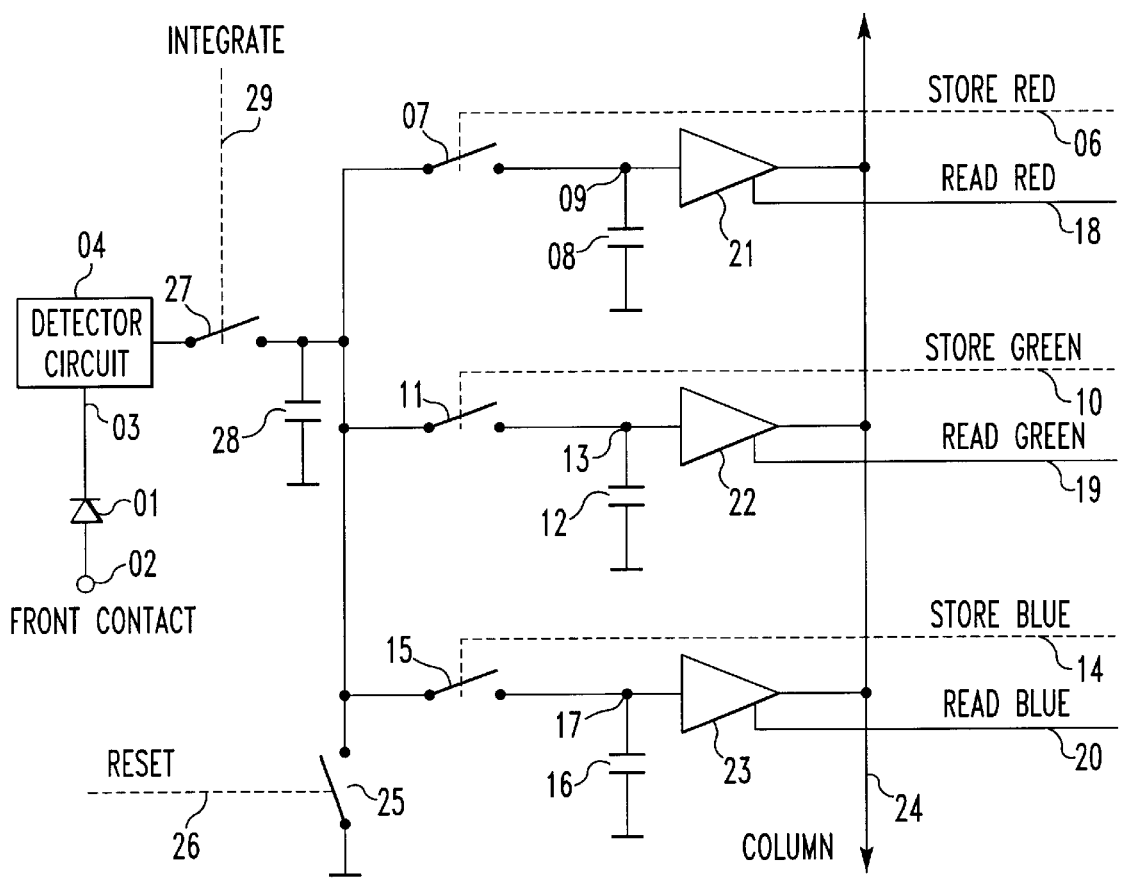
FIG. 3 shows another embodiment of a block diagram of the pixel electronics.

FIG. 3 shows another embodiment of the block diagram of the pixel electronics for short-term exposure with the three integration circuits for red, green and blue, with only one integrator medium (27, 28) and several memory storage devices (07, 08; 11, 12; 15, 16). In this context, reference numerals (01, 02) represent an optoelectronic converter and detector circuit (04) operates to adjust and regulate the electric voltage via the photodiode (02). Switch (27) and integration capacitor (28) form an integration medium. Connected to the integration medium are three controllable memory storage media elements, each including a switch and a capacitor (07, 08; 11, 12; 15, 16). The measured values stored in these media are transferred, via the readout amplifiers (21, 22, 23) to a joint output line (24) or to three separate output lines (18, 19, 20). As previously described, FIG. 1 depicts an embodiment where the integrator and memory storage media are combined to form one single component, which is present at least twice in the image point unit.

Figure 4:
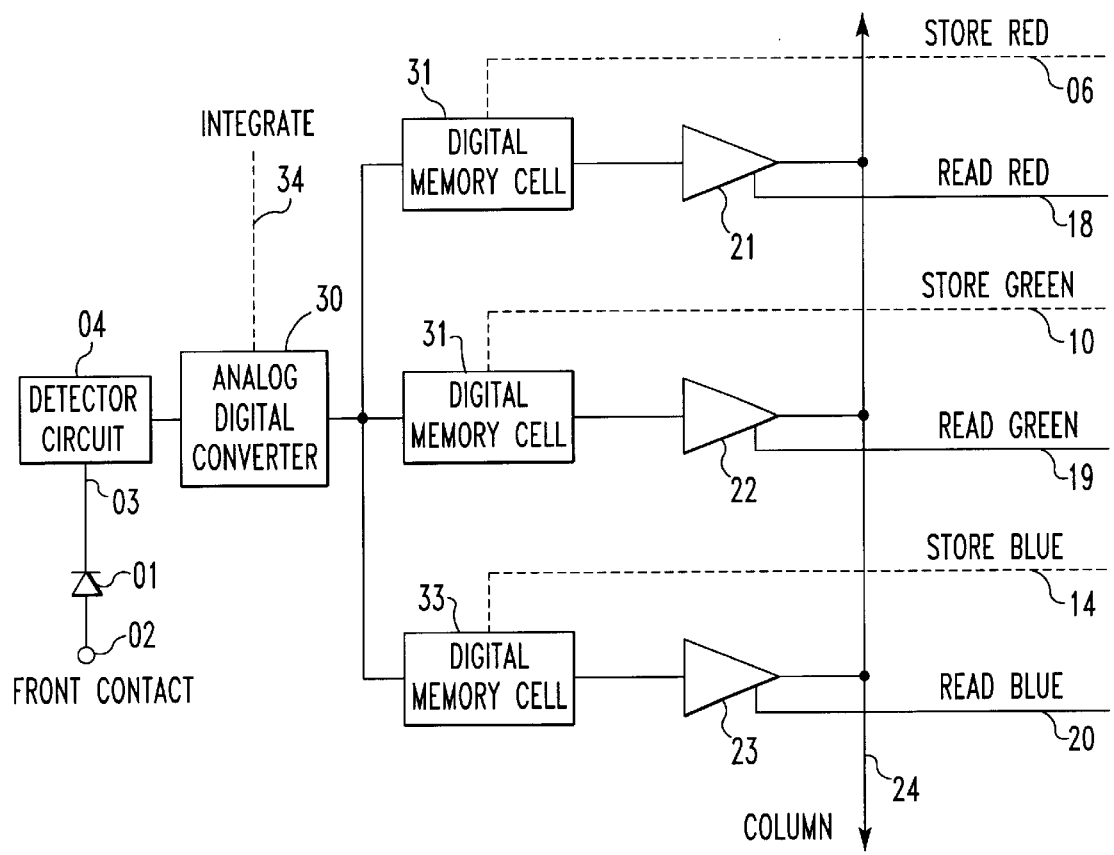
FIG. 4 shows another embodiment of a block diagram of the pixel electronics.

FIG. 4 shows another embodiment of the block diagram of the pixel electronics for short-term exposure with the three integration circuits for red, green and blue, where the integration of the photocurrent takes place inside an analog-digital converter (30), which at the same time implements the conversion into digital signals, which are subsequently deposited in at least two digital memory cells (31, 32, 33). It is connected to respective digital readout buffers (21, 22, 23).

Figure 5:
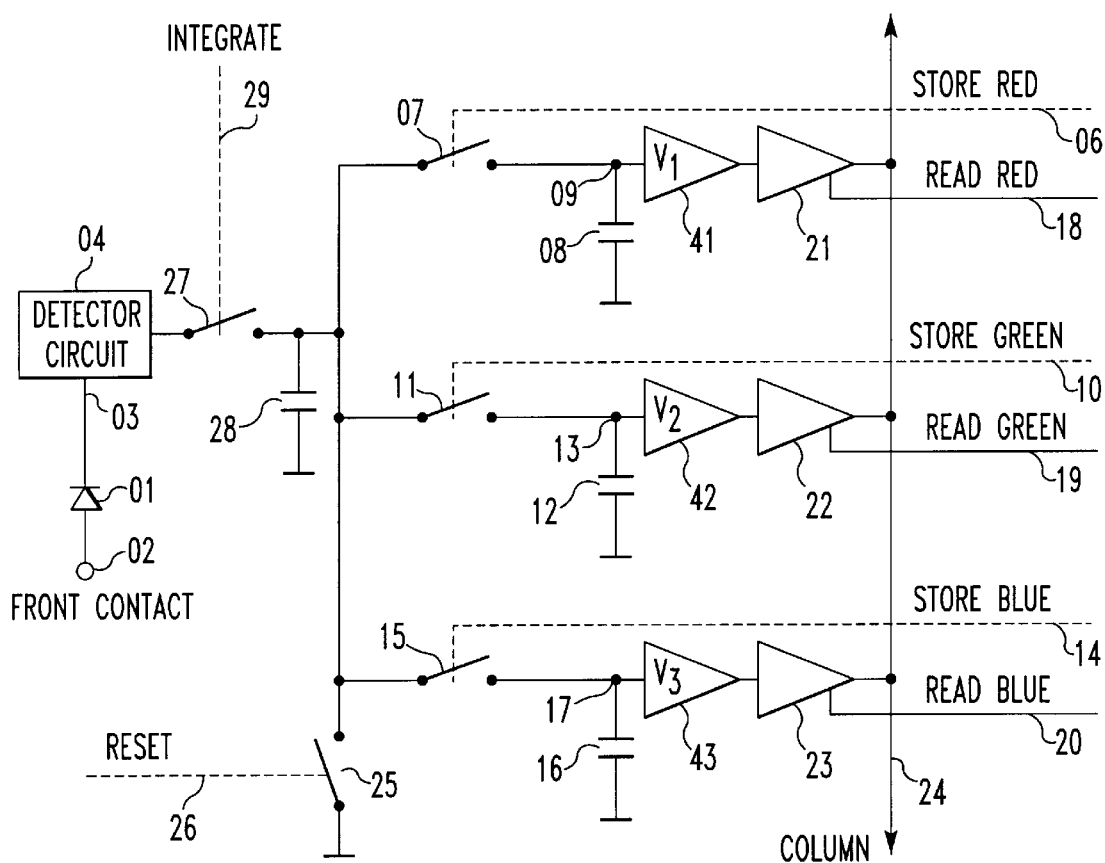
FIG. 5 shows another embodiment of a block diagram of the pixel electronics.

FIG. 5 shows another embodiment of the block diagram of the pixel electronics for short-term exposure with the three integration circuits for red, green and blue, where in each branch an amplifier (41, 42, 43) is interpolated between the memory storage media (07, 08; 11, 12; 15, 16) and the digital readout buffer (21, 22, 23), in which situation the individual amplification factors, $V_1, V_2, V_3$ may be different.

Figure 6:
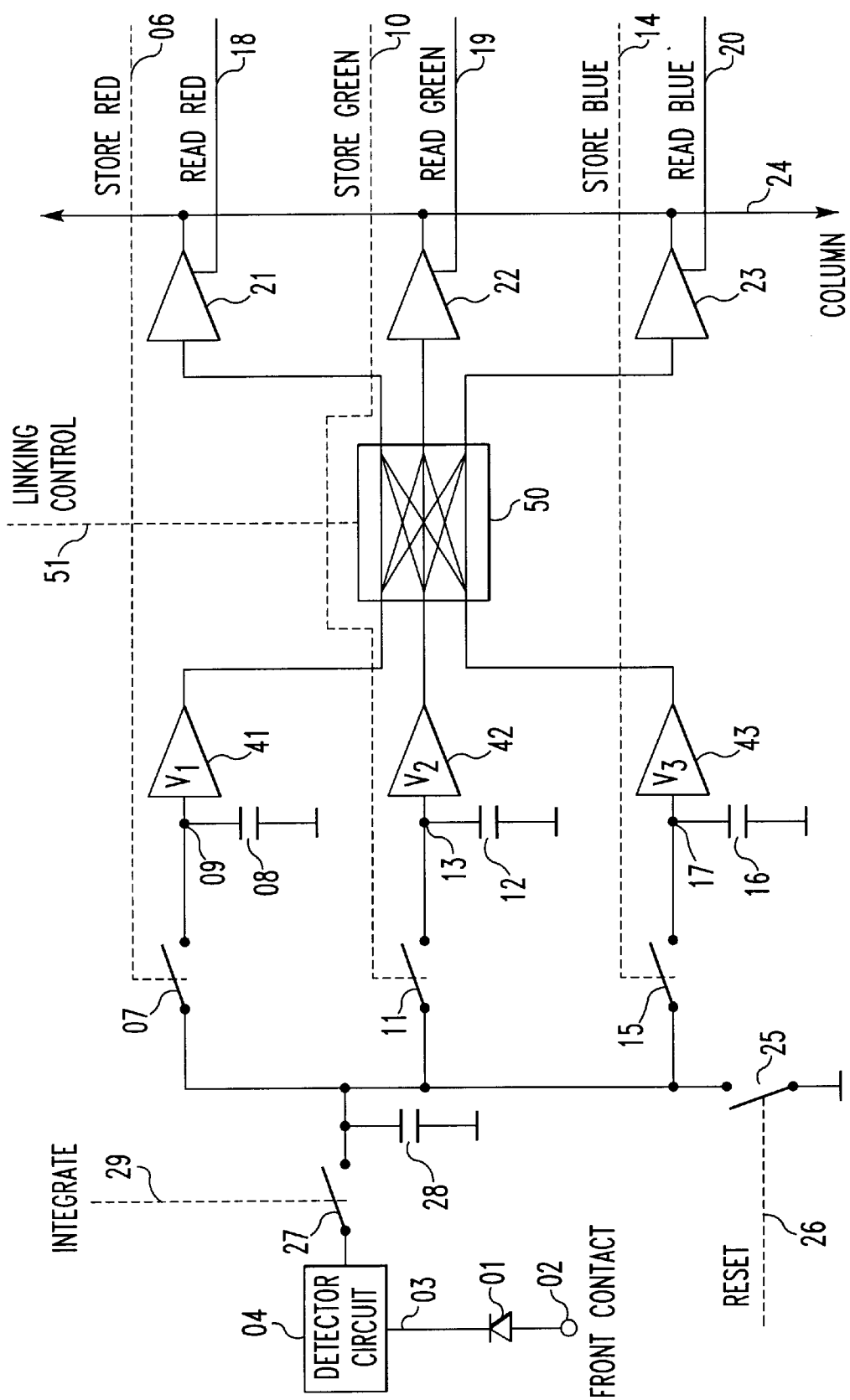
FIG. 6 shows another embodiment of a block diagram of the pixel electronics.

FIG. 6 shows another embodiment of the block diagram of the pixel electronics for short-term exposure with the three integration circuits for red, green and blue that further includes, in addition to FIG. 5, a linking matrix (50), which links the individual color signals, linear or non-linear, with one another.

Figure 7:
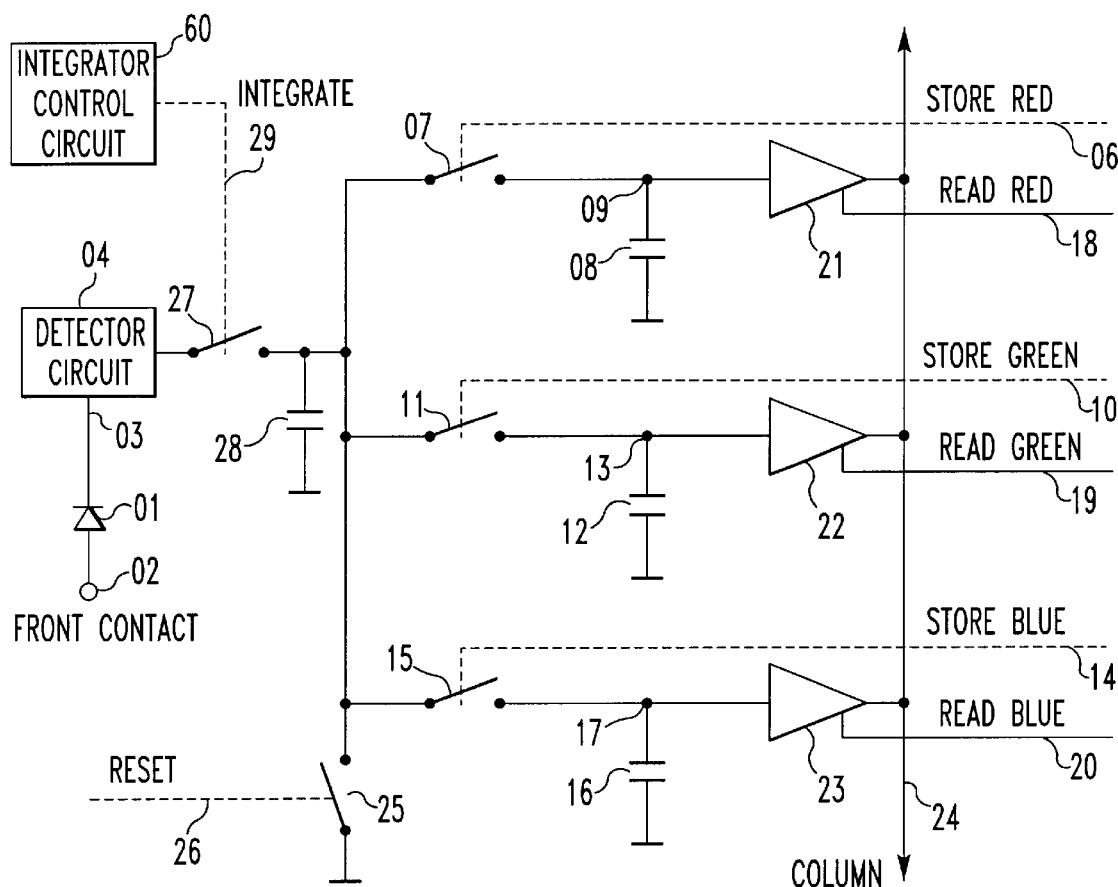
FIG. 7 shows another embodiment of a block diagram of the pixel electronics.

FIG. 7 shows another embodiment of the block diagram of the pixel electronics for short-term exposure with the three integration circuits for red, green and blue, where the control signals for the integrator media are generated in an integrator control circuit (60), which determines the end time point of the integration duration in such a way that higher radiation intensities lead to shorter integration times, and lower radiation intensities lead to longer integration times.

Figure 8:
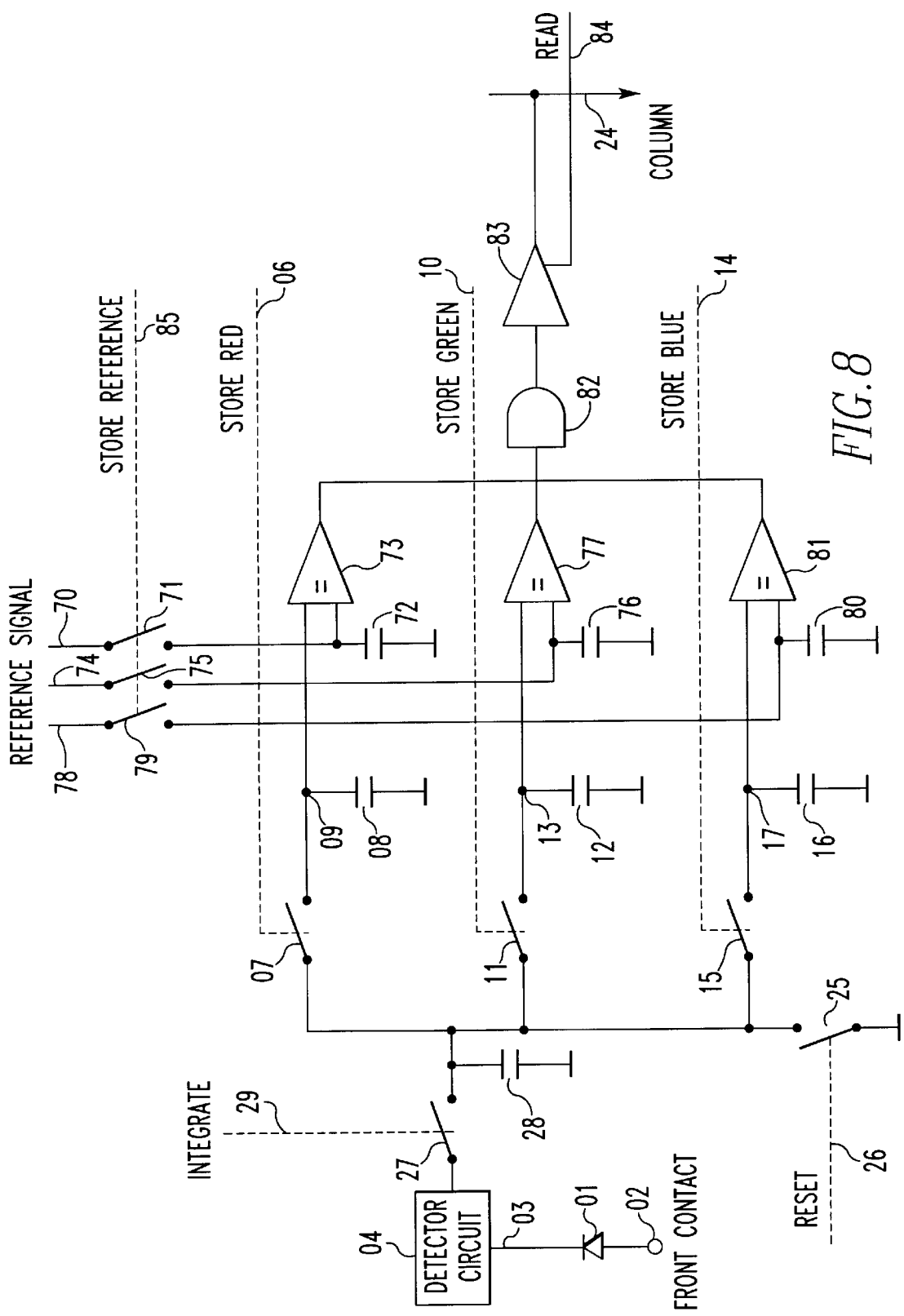
FIG. 8 shows another embodiment of a block diagram of the pixel electronics.

FIG. 8 shows another embodiment of the block diagram of the pixel electronics for short-term exposure with the three integration circuits for red, green and blue, where the variant makes provisions for a comparison device at each image point in each signal branch, comprising in each case of a comparator (73, 77, 81), and an additional memory storage unit (72, 76, 80), into which the reference signals (70, 74, 78) specified from the outside can be stored by means of the switches (71, 75, 79). The result of the comparison operations is linked with the aid of AND gate (82) and read out via the read-out circuit (83).

FIGS. 9A, 9B, 9C, and 9D represent the photoactive layer sequences of the optoelectric converter, capable of being controlled with regard to color sensitivity. The additional optical layers are, e.g., transparent conductive oxide layers or optical filter layers, such as spectral band filters.

Figure 10:
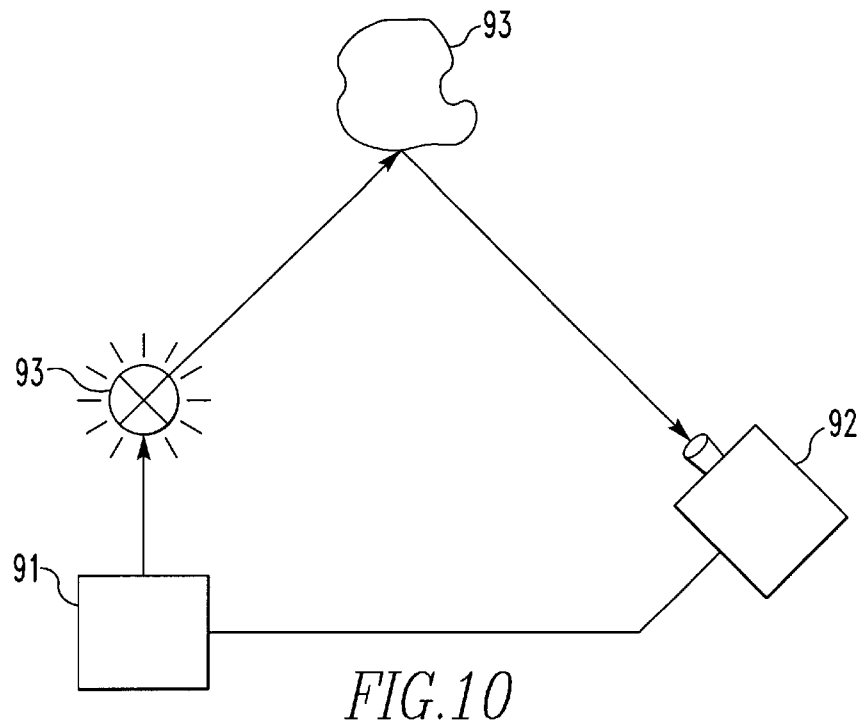
FIG. 10 shows an optical sensor in connection with a high-speed lighting system and a camera system.

FIG. 10 a sketch of an embodiment of the optical sensor in connection with a high-speed lighting system (90, 91) and a camera system (92). Reference element (93) represents any desired object. The high-speed lighting system comprises a light source (90), which is actuated by a control device (91) pertaining to it in such a way that it briefly illuminates the object (93) in each case. During its high-speed illumination, which takes place in synchronization with the camera system (92), the object is recorded by the camera system. The camera system (92) comprises the color image sensor according to the present invention.

Figure 11:
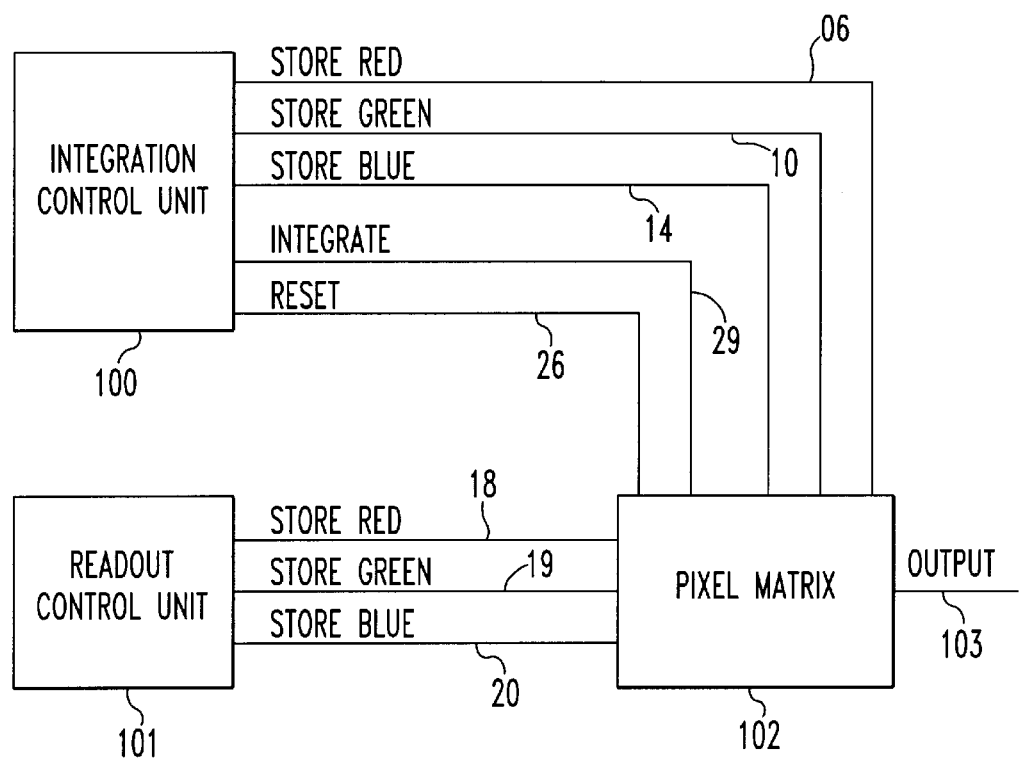
FIG. 11 shows a pixel matrix, integration control unit, and readout control unit.

FIG. 11 shows a block diagram comprises the pixel matrix (arrangement of pixel units, 102), a readout control unit (101), which provides the signals Read Red (18), Read Green (19) and Read Blue (20) necessary for read out of the measured pixel values, and an integration control unit (100), which delivers the Store signals (06, 10, 14) and the Integrate (29) and Reset (26) signals.

Figure 12:
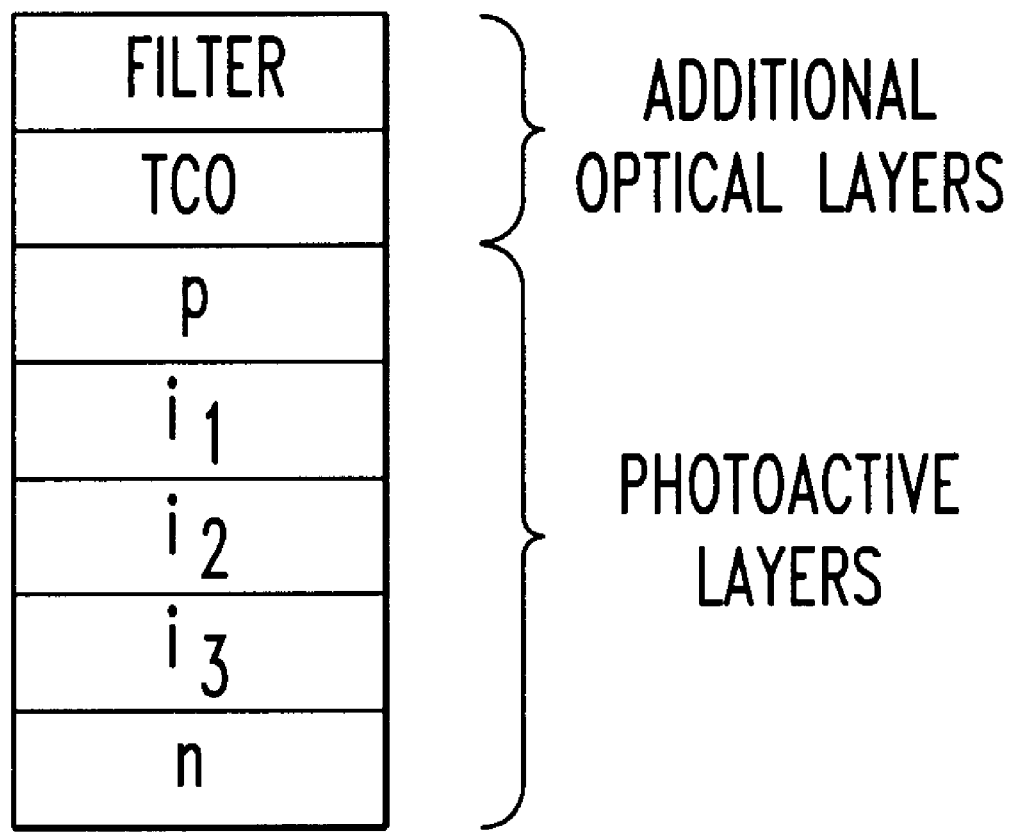
FIG. 12 shows photoactive layers in conjunction with additional optical layers.

FIG. 12 illustrates the photoactive layers in conjunction with additional optical layers. The system that constitutes the photoactive layers is represented by the layer sequence given in FIG. 9C as an example. The additional optical layers are represented by a transparent conductive oxide (TCO) and a filter. Of course, these should only be regarded as examples. Other photoactive as well as additional layers are also possible.

The above discussion is intended to be merely illustrative of the invention. Those having ordinary skill in the art may devise numerous alternative embodiments without departing from the spirit and scope of the following claims.

FIG. 1 shows the block diagram of a pixel for short-term exposure in TFA technology. The light-sensitive and color-selective thin-film detector 01 of amorphous silicon is above the pixel circuit. Its front contact 02 is designed for all pixels together. The other contact 03 leads to the detector circuit 04 which is an ASIC design. This detector circuit 04 holds the voltage on contact 03 of detector 01 at a constant potential in each of the three exposure phases and relays photoelectric current 05 emitted by detector 01 to the integration circuits 06 . . . 17 illustrated at the far right.

Color detector 01 is designed so that its spectral sensitivity can be switched among the colors red, green and blue by selecting the voltage between its contacts 02 and 03. Since the voltage at contact 03 is kept at a constant potential by detector circuit 04, it is sufficient for selecting the spectral sensitivity to switch the voltage on front contact 02 to the corresponding color voltages jointly for all detectors.

The short-term exposure phase begins by setting the voltage on front contact 02 so that detector 01 has a maximum spectral sensitivity for red light. Then the integrate-red signal 06 switches on the integration switch 07 for the red signal, and the photoelectric current 05 proportional to the red component of the light striking the pixel flows to integration capacitor 08. A voltage signal 09, whose amplitude is proportional to the corresponding photoelectric current 05 and the selected integration time Trot [Tred] and is inversely proportional to the value of capacitor 08, is integrated on capacitor 08. To terminate the integration time, the integrate-red signal 06 switches off the integration switch 07 for the red current, and capacitor 08 retains the integrated red signal 09.

Then, for generating the green signal, the voltage on front contact 02 is set so that detector 01 has a maximum spectral sensitivity for green light. After a certain transient recovery time for color detector 01, the resulting photoelectric current 05, which is proportional to green light, is integrated by analogy with the red signal over the green current switch on the green signal capacitor 12 for the time Tgrün [Tgreen] for which the integrate-green signal 10 is active. The green signal 13 integrated on green signal capacitor 12 is in turn proportional to the green current 05 and to the integration time Tgrün and is inversely proportional to the green capacitance 12.

Finally, by analogy with this, the blue signal is generated by setting the voltage on front contact 02 so that detector 01 has a maximum sensitivity for blue light. The blue current 05 which is established after a certain transient recovery time is integrated over blue current switch 15 on the blue signal capacitor 16 for the time Tblau [Tblue] for which the integrate-blue signal 14 is active. The blue signal 17 integrated on blue signal capacitor 16 is proportional to the blue current 05 and to the integration time Tblau and is inversely proportional to the blue capacitance 16.

Thus, the short-term exposure phase is concluded, and the intensity-proportional signals to the three primary colors red, green and blue are stored in color capacitors 08, 12, and 16. In the readout phase which then follows, the reading signals read-red 18, read-green 19 and read-blue 20 switch the color signals 08, 12 and 16 one after the other to the column readout line column 24 over read buffers 21, 22, 23.

The image cycle is concluded with the erasing of the color signals. To do so, reset switch 25 and color current switches 07, 11 and 15 are closed by activating reset signal 26 and integrate signals 06, 10 and 14, so that all color capacitances are deleted at the same time. Thus, the pixel is again in the initial state, and the next integration phase can begin.

Figure 2:
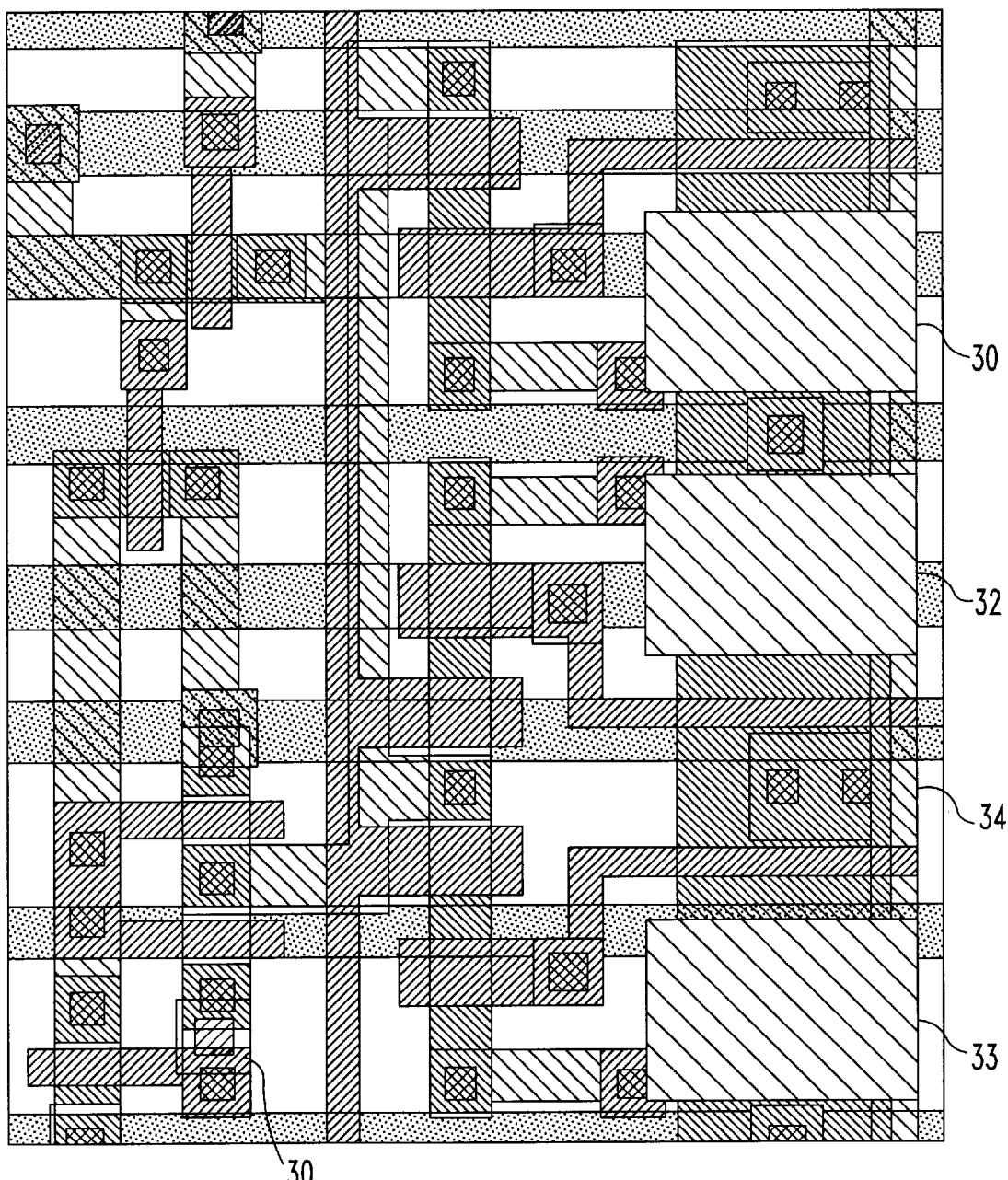
FIG. 2 shows the layout of such a pixel.

FIG. 2 shows a pixel layout which implements all pixel functions diagramed in FIG. 1 in CMOS technology and can be manufactured in TFA technology together with a color-selective thin-film detector deposited on it. The contact for detector 01 deposited vertically on this circuit can be seen as a 1.6 μm×1.6 μm rectangle 30 in FIG. 2. The three color capacitors 31, 32 and 33, corresponding to capacitances 08, 12 and 16 in FIG. 1 are emphasized especially clearly. Outputs 24 of all pixels of the column are relayed to the column amplifier over metal path 34.

The layout was designed in a 0.6 μm CMOS process and it takes up as much space (approximately 16 μm×18 μm) as four pixels side by side, which are needed in a mosaic sensor to generate the full color information. In an advanced process (<0.5 μm) which is already available, even less area would be required.

What is claimed is:

1. An optical sensor for assembling an image, comprising an arrangement of pixel units, each pixel unit receiving incident radiation of a portion of said image, each said pixel unit comprising:
    an optoelectronic converter for converting the incident radiation into a photoelectric current depending on intensity and wavelength of said incident radiation, wherein the optoelectronic converter is selectively controlled based on a selected spectral sensitivity;
    an integrator medium for deriving measured values corresponding to the detected photoelectric current and to the selected spectral sensitivity;
    at least two controllable parallel storage devices, such that at least two of said measured values, each assigned to different spectral ranges of the incident radiation, are stored during a measurement period and subsequently read out together to form the relevant color information for a pixel element representing said portion of said image; and
    an amplifier with an adjustable gain factor being provided for each of the at least two controllable parallel storage devices such that the gains in the effect in integration of the photoelectric currents are different from one another with regard to individual color components, wherein each said amplifier outputs a respective individual color signal.

2. An optical sensor according to claim 1, wherein said at least two measured values, each assigned to different spectral ranges, are detected in chronological succession within the measurement period.

3. An optical sensor according to claim 1 wherein the sensor is a planar sensor.

4. An optical sensor according to claim 1 wherein the sensor is a line sensor.

5. An optical sensor according to claim 1, wherein at least one of the spectral ranges of the optoelectronic converter is in the range of visible light.

6. An optical sensor according to claim 1, wherein at least one of the spectral ranges of the optoelectronic converter is in the ultraviolet or infrared range.

7. An optical sensor according to claim 1, wherein an analog-digital converter and at least two digital memories are provided downstream from the optoelectronic converter.

8. An optical sensor according to claim 1, wherein additional optical layers are applied before a photoactive layer.

9. An optical sensor according to claim 1, wherein a linear linking element is coupled to each of said amplifier, such that the individual color signals are linked according to its respective weighting.

10. An optical sensor according to claim 9, wherein linking of said individual color signals occurs in the periphery of the sensor.

11. An optical sensor according to claim 1, wherein a comparator device, which is deposited a reference signal for a preselectable color, is provided for each of the at least two storage devices.

12. An optical sensor according to claim 1, wherein the relevant color information for the respective pixel element is relayed synchronously over separate readout lines.

13. An optical sensor according to claim 1, wherein the integrator medium is provided with a period controlling device for determining an end point of the integration period, such that higher radiation intensities lead to shorter integration periods, and lower radiation intensities lead to longer integration periods.

14. An optical sensor according to claim 1, wherein said optical sensor has the following layer sequence:

(a) an n-conducing a-Si:H layer, (b) a first intrinsically conducing a-Si:H layer, (c) a p-conducting a-Si:H layer, (d) a second intrinsically conducting a-Si:H layer comprising a first component layer with a higher $\mu$-Tau product and a second component layer with a lower $\mu$-Tau product in comparison with the first component layer, (e) an n-conducting a-Si:H layer.

15. An optical sensor according to claim 1, wherein said optical sensor has the following layer sequence:

(a) a p-conducting a-Si:H layer, (b) a first intrinsically conducing a-Si:H layer, (c) an n-conducting a-Si:H layer, (d) a second intrinsically conducting a-Si:H layer, comprising a first component layer with a higher $\mu$-Tau product and a second component layer with a lower $\mu$-Tau product in comparison with the first component layer, (e) a p-conducting a-Si:H layer.

16. An optical sensor according to claim 1, comprising the following layer sequence:

(a) a p-conducting a-Si:H layer, (b) an intrinsically conducting a-Si:H layer, comprising three component layers (I, II, III) having different dielectric constants, where component layers of a low dielectric constant always precede component layers having a higher dielectric constant in the direction of incidence of light, (c) an n-conducing a-Si:H layer.

17. An optical sensor according to claim 1 comprising the following layer sequence:

(a) a p-conducting a-Si:H layer (b) an intrinsically conducting a-Si:H layer, comprising three component layers having different dielectric constants, where component layers of a low dielectric constant always precede component layers having a higher dielectric constant in the direction of incidence of light, (c) a p-conducting a-Si:H layer.

18. An optical sensor according to claim 14, wherein the layer sequence is deposited on the surface of an integrated circuit.

19. An optical sensor according to claim 18, wherein the integrated circuit is an ASIC.

20. An optical sensor according to claim 1, wherein each storage device is a capacitor.

21. An optical sensor according to claim 14, wherein each storage device is a capacitor.

22. An optical sensor according to claim 21, wherein the capacitor is arranged laterally in the layer sequence.

23. An optical sensor according to claim 21, wherein the capacitor is arranged vertically in the layer sequence.

24. An optical sensor according to claim 1, wherein the sensor receives radiation by means of a short-term lighting system.

25. An optical sensor according to claim 24, wherein the short-term lighting system is a flash having a constant light intensity during its burning time.

* * * * *